United States Patent
Kim et al.

(10) Patent No.: US 9,425,283 B2
(45) Date of Patent: Aug. 23, 2016

(54) SEMICONDUCTOR DEVICE AND METHOD FOR MANUFACTURING THE SAME

(71) Applicant: SK hynix Inc., Gyeonggi-do (KR)

(72) Inventors: Suk Ki Kim, Gyeonggi-do (KR); Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/694,763

(22) Filed: Apr. 23, 2015

(65) Prior Publication Data

US 2015/0228751 A1     Aug. 13, 2015

Related U.S. Application Data

(63) Continuation of application No. 14/044,475, filed on Oct. 2, 2013, now Pat. No. 9,040,376.

(30) Foreign Application Priority Data

Jun. 14, 2013    (KR) .................. 10-2013-0068347

(51) Int. Cl.
| | |
|---|---|
| *H01L 21/336* | (2006.01) |
| *H01L 29/66* | (2006.01) |
| *H01L 29/78* | (2006.01) |
| *H01L 21/8234* | (2006.01) |
| *H01L 27/24* | (2006.01) |
| *H01L 29/423* | (2006.01) |
| *H01L 29/40* | (2006.01) |

(52) U.S. Cl.
CPC ...... *H01L 29/665* (2013.01); *H01L 21/823487* (2013.01); *H01L 27/2454* (2013.01); *H01L 29/401* (2013.01); *H01L 29/42392* (2013.01); *H01L 29/66666* (2013.01); *H01L 29/7827* (2013.01)

(58) Field of Classification Search
CPC ...................................... H01L 29/6653
USPC ................... 257/E21.622, E21.676
See application file for complete search history.

(56) References Cited

U.S. PATENT DOCUMENTS

| 5,783,479 | A * | 7/1998 | Lin ............... H01L 21/28052 257/E21.199 |
| 6,383,882 | B1* | 5/2002 | Lee ............... H01L 21/28052 257/E21.199 |
| 7,112,498 | B2* | 9/2006 | Jung ............. H01L 21/28044 257/E21.198 |
| 7,482,256 | B2* | 1/2009 | Kim ............... H01L 21/28052 257/E21.176 |
| 2008/0272426 | A1 | 11/2008 | Chae et al. |
| 2010/0270611 | A1 | 10/2010 | Masuoka et al. |

OTHER PUBLICATIONS

Office Action issued by the USPTO for a divisional U.S. Appl. No. 14/694,739 of the parent U.S. Appl. No. 14/044,475 on Apr. 22, 2016.

* cited by examiner

*Primary Examiner* — Chandra Chaudhari
(74) *Attorney, Agent, or Firm* — IP & T Group LLP

(57) ABSTRACT

A semiconductor device forms a salicide layer to surround an upper surface and a circumference of a lateral surface of a pillar. A contact area between the pillar and a lower electrode may be increased to reduce a contact resistance.

8 Claims, 6 Drawing Sheets

SEMICONDUCTOR DEVICE AND METHOD FOR MANUFACTURING THE SAME

CROSS-REFERENCES TO RELATED APPLICATION

This application is a continuation of U.S. patent application Ser. No. 14/044,475 filed on Oct. 2, 2013, which claims priority under 35 U.S.C. 119(a) to Korean application number 10-2013-0008347, filed on Jun. 14, 2013, in the Korean Patent Office. The disclosure of each of the foregoing applications is incorporated herein by reference in its entirety.

BACKGROUND OF THE INVENTION

1. Technical Field

Various embodiments of the inventive concept relate to a semiconductor device and a method for manufacturing the same, and more particularly, to a semiconductor device having a vertical transistor and a method for manufacturing the same.

2. Related Art

With increase in a degree of integration of semiconductor devices, a channel length of a transistor is reduced increasingly. The reduction in the channel length causes drain induced barrier lowering (BIDL) a hot carrier effect, and a short channel effect, such as punch-through.

To alleviate these concerns, various methods, such as a method of reducing a length of a junction region, a method of increasing a channel length by forming a recess in a channel region of the transistor, and the like are suggested.

However, as the degree of integration of semiconductor devices is approaching Giga bytes, it may be difficult to satisfy a required device area using a planar transistor structure in which junction regions are formed at both sides of gates even when the channel length is scaled down. Therefore, to alleviate this concern, vertical transistor technology is suggested.

A semiconductor device having a vertical transistor in the related art will be described with reference to FIG. 3.

The semiconductor device in the related art includes a plurality of pillars 115 extending to a vertical direction from a semiconductor substrate 110, and a gate insulating layer 130 surrounding a lateral surface of each of the pillars 115, and a gate electrode 140 surrounding each of the pillars surrounded with the gate insulating layer 130 to a predetermined height. A silicide layer 160 is formed on an upper surface of each of the pillars, and a lower electrode 170 is formed on the silicide layer 160.

A level of difficulty in a process is considerably increasing according to decrease in the size of semiconductor device having the vertical channel transistor, specifically, a phase-change random access memory (PRAM). In particular, an ON current may be reduced due to increase in a contact resistance according to decrease in size of a 20 nm-graded or less device.

Therefore, there is a need for a method for increasing an ON current due to reduction in a contact resistance in a recent semiconductor device.

SUMMARY

One or more exemplary embodiments of the present invention are directed to a semiconductor device that may increase an ON current due to reduction in a contact resistance when manufacturing the semiconductor device and a method for manufacturing the same.

According to an aspect of an exemplary embodiment of the present invention, a semiconductor device may include a semiconductor substrate, a plurality of pillars formed to extend substantially perpendicular from the semiconductor substrate, a gate electrode formed to surround a circumference of a lower portion of a lateral surface of each of the pillars and to have an upper surface having a height lower than a height of an upper surface of each of the pillars, a salicide layer formed to surround the upper surface of each of the pillars and a circumference of an upper portion of a lateral surface of each of the pillars, a lower electrode formed to surround an upper surface and a lateral surface of the salicide layer, and a first spacer formed to surround a portion of the lateral surface of each of the pillars, between the upper surface of the gate electrode and the salicide layer.

According to an aspect of another exemplary embodiment of the present invention, a method for manufacturing a semiconductor device may include forming a plurality of pillars by etching a semiconductor substrate using a hard mask pattern, gap-filling a conductive material between the pillars, and etching back the conductive material so that an upper surface of the etching backed conductive material has a height lower than that of an upper surface of each of the pillars, forming a first spacer on a lateral surface of the hard mask pattern and on an upper portion of a lateral surface of each of pillars, which is uncovered with the etching backed conductive material, the first spacer formed of the same material as that of the hard mask pattern, removing the hard mask pattern and an upper portion of the first spacer to expose the upper surface of each of the pillars and a portion of the upper portion of the lateral surface of each of the pillars, forming a salicide layer to surround the exposed upper surface of each of the pillars and the exposed portion of the upper portion of the lateral surface of each of the pillars, and forming a lower electrode to surround the salicide layer.

These and other features, aspects and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
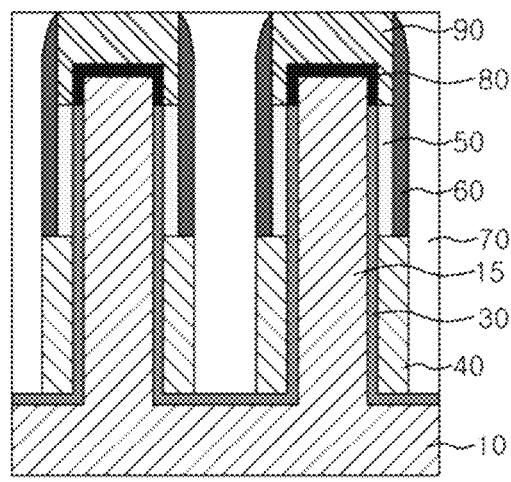
FIG. 1 is a cross-sectional view illustrating a semiconductor device according to an embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. In addition, a singular form may include a plural form as long as it is not specifically mentioned in a sentence.

Hereinafter, a semiconductor device according to an embodiment of the inventive concept will be described using a phase-change random access memory (PRAM). However, it would have been obvious to the person having ordinary skill in the art that the inventive concept may be applied to any nonvolatile memory device using a resistor, such as a resistive RAM (RRAM) or a ferroelectric RAM (FRAM).

Referring to FIG. 1, a semiconductor device (a PRAM) according to an embodiment of the inventive concept may include a vertical transistor structure.

The vertical transistor structure may include a plurality of pillars 15 extending to a vertical direction from a semiconductor substrate 10, a gate insulating layer 30 formed on a surface of the semiconductor substrate 10 and surrounding a lateral surface of each of the pillars 15, and a gate electrode 40 surrounding each of the pillars 15 surrounded with the gate insulating layer 30 to a predetermined height.

An upper surface of the gate electrode 40 is lower than upper surfaces of the gate insulating layer 30 and the pillars 15.

As illustrated in FIG. 1, a self-aligned silicide (salicide) layer 80 is formed on an upper portion of the vertical transistor structure, that is, on an upper portion of each of the pillars 15 on which the gate electrode 40 is not formed.

The salicide layer 80 is formed to surround an upper surface of each of the pillars 15 and a circumference of a lateral surface of the upper portion of each of the pillars 15. As compared with a silicide layer only formed on an upper surface of each of the pillars in the related art, it may be seen that a substantial surface area of the salicide layer 80 is increased.

A lower electrode 90 is formed to surround an upper surface and a lateral surface of the salicide layer 28.

Spacers 50 and 60 are formed on an upper portion of the vertical transistor structure, that is, the lateral surface of the upper portion of each pillar 15 on which the gate electrode 40 is not formed it) as illustrated in FIG. 1. The spacers may include a first spacer 50 formed to surround a space between the gate electrode 40 and the lower electrode 90 on the lateral surface of each of the pillars 15 and a second spacer 60 formed to surround lateral surfaces of the first spacer 50 and the lower electrode 90. At this time, the first spacer 50 may include a material having the same etch selectivity as or a similar etch selectivity to that of a hard mask pattern (see 20 of FIG. 2A) for the formation of the pillars 15.

That is, in an embodiment of the inventive concept, a contact area of the salicide layer 80 with the pillar 15 is increased by a circumferential area in the lateral surface of the upper portion of the pillar 15, and thus a contact resistance of the salicide layer 80 with the lower electrode 90 is reduced. An ON current is increased according to reduction in the contact resistance of the salicide layer 80 with the lower electrode 90.

A method for manufacturing a semiconductor device according to an embodiment will be described below.

Figure 2A:
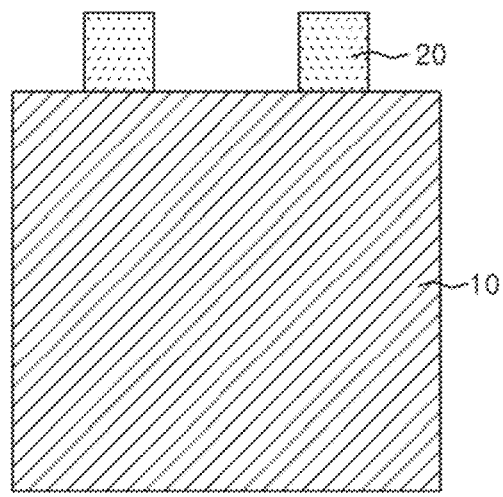
FIGS. 2A to 2I are cross-sectional views illustrating a method for manufacturing a semiconductor device according to an embodiment of the inventive concept.

As illustrated in FIG. 2A, a hard mask layer (not shown) is formed on a semiconductor substrate 10. The hard mask layer may be formed of a material having an etch selectivity different from the semiconductor substrate 10, for example, silicon oxide. A photoresist pattern (not shown) is formed on the hard mask layer through a general process, and the hard mask layer is etched using the photoresist pattern as a mask to form a hard mask pattern 20.

Figure 2B:
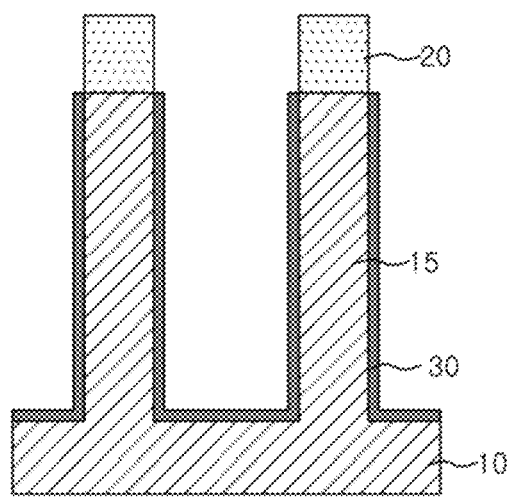

As illustrated in FIG. 2B, a semiconductor substrate 10 is etched to a predetermined depth using a hard mask pattern 20 as a mask to form a plurality of pillars 15 in the semiconductor substrate 10. The pillars 15 are formed to a direction extending substantially perpendicular from the semiconductor substrate 10.

A gate insulating layer 30 is formed on the semiconductor substrate 10 including the pillars 15, that is, an exposed lateral surface of each of the pillars 15 and on a surface of the semiconductor substrate 10 between the pillars 15. For example, the gate insulating layer 30 may include a silicon oxide ($SiO_2$) layer, a hafnium oxide ($HFO_2$) layer, a tantalum oxide ($Ta_2O_5$) layer, or an oxide/nitride/oxide (ONO) layer.

After the pillars 15 and the gate insulating layer 30 are formed, impurities are doped into the semiconductor substrate 10 to form a source region (not shown).

Figure 2C:
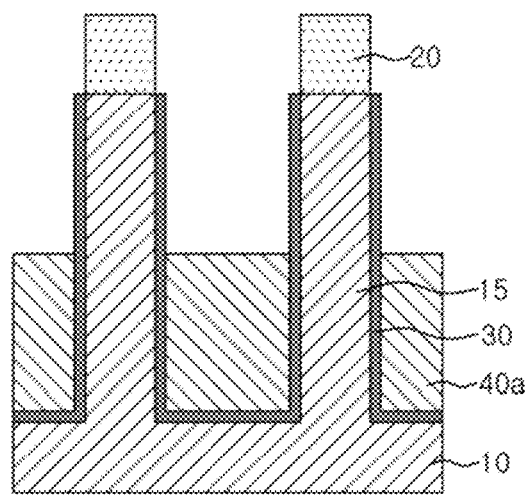

As illustrated in FIG. 2C, a conductive material 40a is gap-filled in the semiconductor substrate including the gate insulating layer 30 illustrated in FIG. 2B, and then etched back so that the gap-filled conductive material 40a has a predetermined height.

Figure 2D:
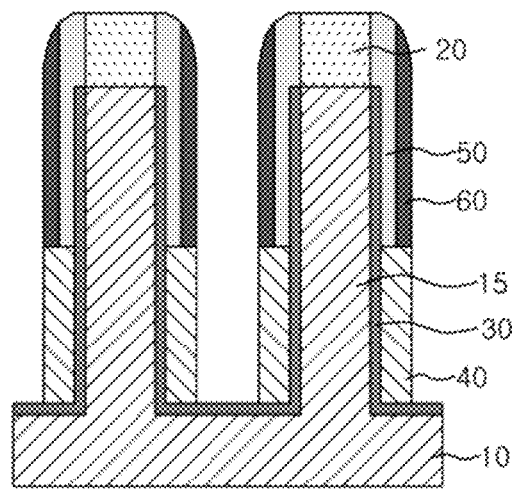

As illustrated in FIG. 2D, a spacer surrounding a lateral surface of each of the pillars 15 is located on the conductive material 40a and a lateral surface of the hard mask pattern 20. The spacer includes a first spacer 50 and a second spacer 60 located in an outer side of the first spacer 50.

The first spacer 50 may be formed by depositing a material for the first spacer, for example, an oxide having the same etch selectivity as or a similar etch selectivity to that of the hard mask pattern 20 along a surface of the semiconductor substrate including the conductive material 40a illustrated in FIG. 2C, and spacer-etching the material for the first spacer.

The second spacer 60 is located in the outer side of the first spacer 50 as described above. The second spacer 60 may be formed by depositing a material for the second spacer, for example, a nitride along a step of the surface of the semiconductor substrate including the first spacer 50, and spacer-etching the material for the second spacer.

The conductive material (see 40a of FIG. 2B) is etched to form a gate electrode 40. The gate electrode 40 may surround a lateral surface of a lower portion of each of the pillars 15 to a predetermined height. That is, the gate electrode 40 may be formed to have an upper surface having a height lower than that of an upper surface of each of the pillars 15.

Figure 2E:
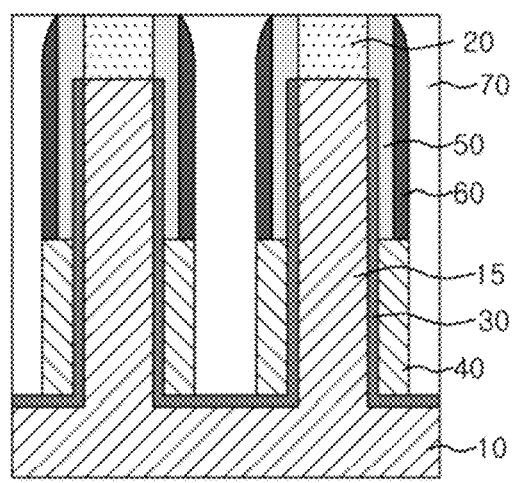

As illustrated in FIG. 2E, a gap-fill insulating material is formed on the semiconductor substrate including the gate electrode 40 illustrated in FIG. 2D, and then planarized until an upper surface of the second spacer 60 is exposed to form an inter-cell insulating layer 70.

Figure 2F:
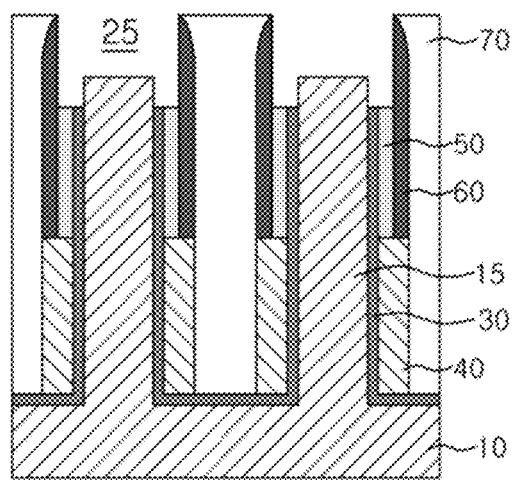

As illustrated in FIG. 2F, the hard mask pattern 20 and a portion of the first spacer 50 having the same etch selectivity as that of the hard mask pattern 20 are removed through a dipping out process. Therefore, in the embodiment of inventive concept, a space 25 exposing the upper surface and a lateral surface of an upper portion of each of the pillars 15 is formed.

Into the upper portion of each of the pillars 15 exposed by removing the hard mask pattern 20 and the portion of the first spacer 50 in the removing process, impurities are doped to form a drain region (not shown).

Figure 2G:
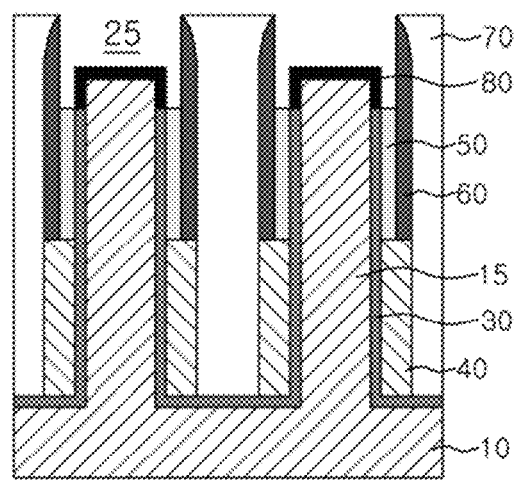

As illustrated in FIG. 2G, a self-aligned silicide (salicide) layer 80 is formed along the upper surface and a circumference of the lateral surface of the upper portion of each of the pillars 15 exposed through the above-process.

Specifically, a salicide formation material is deposited in the space 25 formed by removing the hard mask pattern 20 and the portion of the first spacer 50 among a resultant structure of FIG. 2F. The salicide formation material may include a transition metal, such as cobalt (Co), titanium (Ti), nickel (Ni), or tungsten (W).

The pillars 15 may react with the salicide formation material through a heat treatment. The salicide formation material reacts with each of the pillars at a direct contact portion thereof to form a salicide layer 80 through a selective reaction of silicon and metal.

A non-reacted portion of the salicide formation material may be removed through a general process. In other words, the salicide layer 80 is formed to surround the upper surface and the circumference of the lateral surface of the upper portion of each of the pillars 15.

Figure 2H:
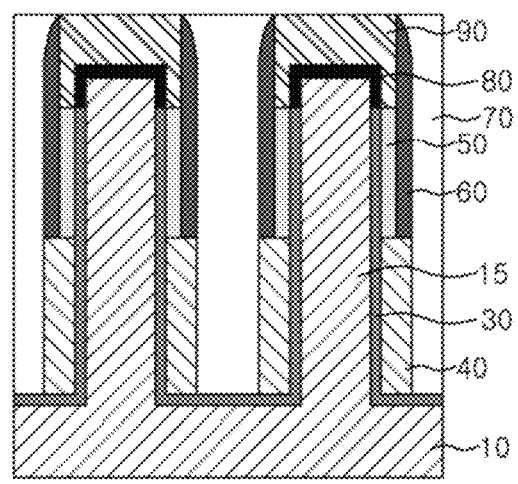
Figure 2I:
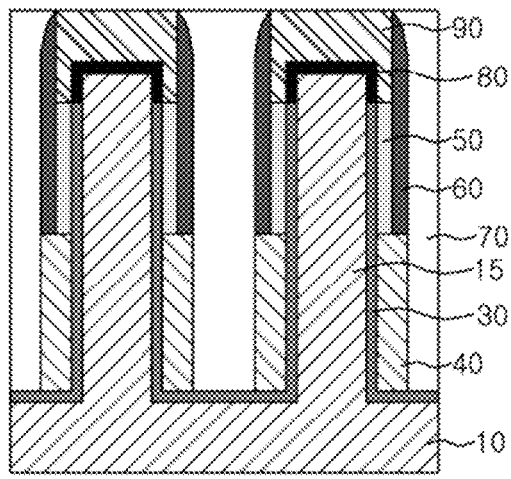
Figure 3:
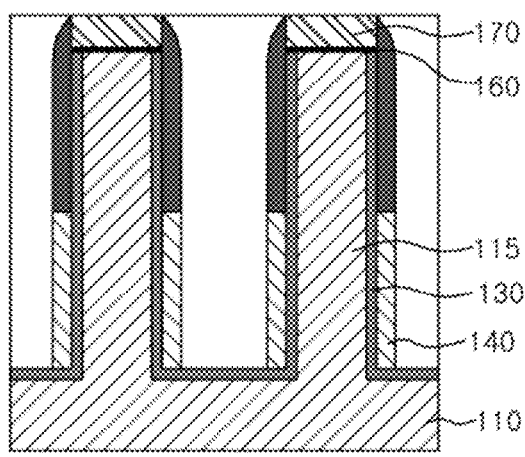
FIG. 3 is a cross-sectional view us a ng a semiconductor device in the related art.

As illustrated in FIG. 2H, a lower electrode 90 is formed on each of the pillars 15 on which the salicide layer 80 is formed. The lower electrode 90 may be formed by depositing a conductive material on the semiconductor substrate including the salicide layer 80 illustrated in FIG. 2G and then planarized through an etch back process.

The conductive material for the lower electrode 90 may include a material such as titanium nitride (TiN), tantalum nitride (TaN), tungsten nitride (WN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium (Ti), tungsten (W), molybdenum (Mo), tantalum (Ta), titanium silicide (TiSi), tantalum silicide (TaSi), titanium oxynitride (TiON), titanium aluminum oxynitride (TiAlON), tungsten oxynitride (WON), or tantalum oxynitride (TaON).

A phase-change layer (not shown) and an upper electrode (not shown) may be formed on the lower electrode 90 to complete the PRAM.

Therefore, in the semiconductor device manufactured through the manufacturing method, as the salicide layer formed between the pillar and the lower electrode is formed along the upper surface and the circumference of the lateral surface of the upper portion of the pillar, a substantial surface area of the salicide layer may be increased compared to the related art. Thus, a contact area of the salicide layer according to an embodiment of the inventive concept with the lower electrode may be increased, and thus a contact resistance of the salicide layer with the lower electrode may be reduced.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing a semiconductor device, the method comprising:
    forming a plurality of pillars on a semiconductor substrate;
    forming a gate electrode to surround each of the pillars;
    forming masking layer including a groove on the gate electrode and each of the pillars, wherein a top portion and an upper sidewall of each of the pillars are exposed by the groove;
    forming a silicide layer on the exposed top portion and the exposed upper sidewall of each of the pillars with maintaining an insulation between the silicide layer and the gate electrode; and
    forming a lower electrode on a whole surface of the silicide layer to fill the groove with a conductive material.

2. The method of claim 1, wherein the forming the masking layer comprises:
    forming a hard mask layer on each of the pillars;
    forming a first spacer to surround a circumference of each of the pillars and the hard mask layer on the gate electrode;
    forming a second spacer to surround a circumference of the first spacer on the gate electrode; and
    removing the hard mask layer and a portion of the first spacer, to form the groove.

3. The method of claim 2, wherein an etch selectivity of the hard mask layer is same as that of the first spacer.

4. The method of claim 2, wherein the forming the gate electrode comprises:
    forming a gate material to fill spaces between the pillars;
    recessing the gate material so that a height of a remained conductive material is lower than that of each of the pillars; and
    etching the gate material using the first and second spacers as a mask.

5. The method of claim 1, further comprising:
    forming a gate insulating layer on a surface of each of the pillars and the semiconductor substrate between the forming the plurality of pillars and the forming the gate electrode.

6. A method for manufacturing a semiconductor device, the method comprising:
    forming a pillar on a semiconductor substrate;
    forming a gate insulating layer on the pillar and the semiconductor substrate;
    forming a gate material on the semiconductor substrate;
    recessing the gate material so that a remained gate material includes a height being lower than that of the pillar;
    forming a first spacer to surround a circumference of the pillar, on the remained gate material;
    forming a second spacer to surround a circumference of the first spacer;
    patterning the gate material using the first and the second spacers as a mask, to form a gate electrode;
    exposing a top portion of the pillar and an upper sidewall extending from an edge of the top portion of the pillar by removing a portion of the first spacer;
    forming a silicide layer on the exposed top portion and the exposed upper sidewall of the pillar with maintaining an insulation between the silicide layer which is formed at the upper sidewall of each of the pillars and the gate electrode; and
    forming a lower electrode on a whole surface of the silicide layer.

7. The method of claim 6, wherein the forming the pillar comprises:
    forming a hard mask on the semiconductor substrate; and
    etching the semiconductor substrate using the hard mask as a mask pattern for forming the pillar.

8. The method of claim 6, wherein an etch selectivity of the hard mask layer is same as that of the first spacer,
    wherein the hard mask is removed, when the portion of the first spacer is removed for exposing the top portion and the upper sidewall of the pillar.

* * * * *